(12) United States Patent
Confalonieri et al.

(10) Patent No.: US 7,916,575 B2
(45) Date of Patent: Mar. 29, 2011

(54) CONFIGURABLE LATCHING FOR ASYNCHRONOUS MEMORIES

(76) Inventors: Emanuele Confalonieri, Lesmo (IT); Daniele Balluchi, Vimercate (IT); Chris Bueb, Folsom, CA (US); Graziano Mirichigni, Pietracamela (IT)

( * ) Notice: Subject to any disclaimer, the term of this patent is extended or adjusted under 35 U.S.C. 154(b) by 139 days.

(21) Appl. No.: 12/342,342

(22) Filed: Dec. 23, 2008

(65) Prior Publication Data
US 2010/0157718 A1 Jun. 24, 2010

(51) Int. Cl.
*G11C 8/00* (2006.01)
(52) U.S. Cl. ........... 365/233.18; 365/233.17; 365/233.1; 365/193
(58) Field of Classification Search ............. 365/233.18, 365/233.17, 233.1, 193
See application file for complete search history.

(56) References Cited

U.S. PATENT DOCUMENTS

| | | | | |
|---|---|---|---|---|
| 5,126,975 A | * | 6/1992 | Handy et al. | 365/189.14 |
| 5,625,596 A | * | 4/1997 | Uchida | 365/200 |
| 5,668,773 A | * | 9/1997 | Zagar et al. | 365/233.1 |
| 5,829,026 A | * | 10/1998 | Leung et al. | 711/122 |
| 5,996,724 A | * | 12/1999 | Shimizu et al. | 180/446 |
| 6,172,936 B1 | * | 1/2001 | Kitazaki | 365/233.17 |
| 6,587,395 B2 | * | 7/2003 | Akaogi | 365/233.1 |
| 6,670,802 B2 | * | 12/2003 | Dietrich et al. | 324/158.1 |
| 6,836,816 B2 | | 12/2004 | Kendall | |
| 6,920,524 B2 | * | 7/2005 | Lovett | 711/106 |
| 7,020,737 B2 | * | 3/2006 | Imondi et al. | 711/5 |
| 7,093,062 B2 | * | 8/2006 | Cioaca | 711/103 |
| 7,212,464 B2 | * | 5/2007 | Uehara et | 365/230.03 |
| 7,633,800 B2 | * | 12/2009 | Adusumilli et al. | 365/185.09 |

OTHER PUBLICATIONS

"Using Intel Flash Memory: Asynchronous Page Mode and Synchronous Burst mode", Aug. 2004, Intel Application Note 793, pp. 2-28.*

* cited by examiner

*Primary Examiner* — Viet Nguyen
(74) *Attorney, Agent, or Firm* — Trop, Pruner & Hu, P.C.

(57) ABSTRACT

A memory, such as a flash memory, may receive a configuration bit from a memory controller to set the memory in one of two selectable modes. Thus, based on the way the memory controller operates, it can adapt the operation of the memory to suit the memory controller's techniques for entering synchronous burst read mode. In some embodiments, the bit may selectively enable the memory to assume one of two synchronous burst read modes which are based on different arrangements of CLK and ADV# signals.

20 Claims, 2 Drawing Sheets

CONFIGURABLE LATCHING FOR ASYNCHRONOUS MEMORIES

BACKGROUND

This relates generally to asynchronous memories and to latching in asynchronous memories.

An asynchronous memory, such as a flash memory, may have an asynchronous page mode and a synchronous burst mode for reading. These modes can accelerate flash reads. Flash read performance enables direct code execution from the flash memory.

The asynchronous page mode is an asynchronous read operation that improves read performance. On power up or reset, the memory defaults to asynchronous read array mode to enable processors to immediately read from the flash memory. Page mode may also be available.

DETAILED DESCRIPTION

Figure 1:
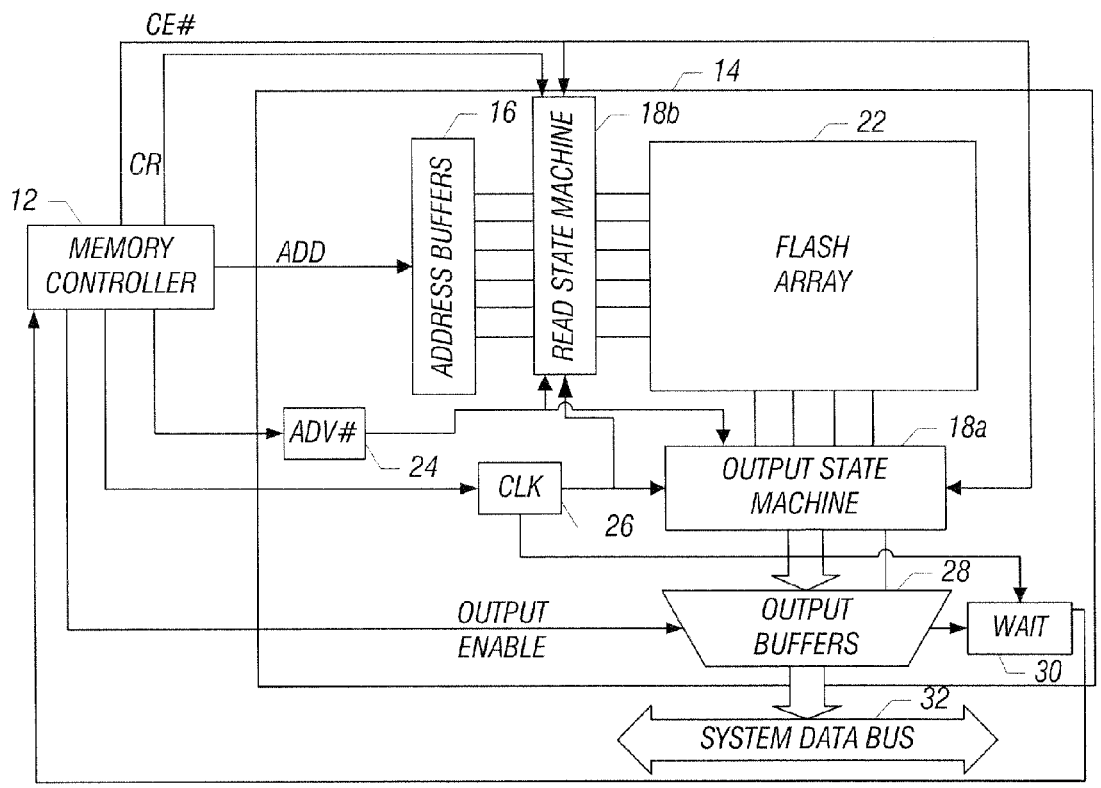
FIG. 1 is a circuit schematic for embodiment of the present invention.

Referring to FIG. 1, many processors and chipsets use an integrated memory controller 12 to access an external memory device 14, such as a flash memory. A memory bus provides a hardware connection between the memory controller 12 and external memory device 14. The memory bus may include address (ADD), data, and control signals (CE#, ADV#, OE, and CLK). The address signals specify the location for writing or reading data during memory access, while data signals transfer information to and from the selected memory device. Control signals are driven by the memory controller 12 to select a particular device and indicate the direction of data transfer.

Synchronous burst mode may use a clock synchronous read operation to improve the read performance for single reads and page mode reads. It may be enabled by programming a read configuration register of the memory device.

Generally, synchronous burst mode provides higher read performance because data is output on clock edges at the clock frequency. The synchronous burst mode uses a signal CLK that is the burst clock input used to synchronize the memory device 14 to the memory controller 12. ADV# is the address valid input to the memory indicating when the address from the processor is valid. ADV# is used by the memory 14 to latch the initial address at the beginning of the burst access.

At the start of a synchronous burst access, the memory controller 12 may drive an initial address (ADD) onto the address buffer and assert CE#, ADV#, and output enable OE#. ADV# is deasserted to latch the initial address.

The memory controller 12 and the flash memory 14 may be separate devices packaged separately or may be packaged in the same device. The memory controller may be a processor or part of a processor in some embodiments.

In accordance with some embodiments, the memory controller 12 may select a configuration for synchronous burst reads by providing a signal CR to a read state machine 18b. This signal selects one of two selectable burst mode read configurations.

The memory 14 may include an array 22 of flash memory devices coupled to the read state machine 18b and an output state machine 18a. Address buffers 16 read the address signals ADD from the memory controller 12. The memory controller 12 also supplies the signal ADV# to the output state machine 18a, the clock signal CLK 26 to the output state machine 18a, the chip enable signal CE# to the output state machine 18a and the output buffers 28. The memory controller 12 may receive a signal from a wait module 30 that is coupled to the output buffers 28. A system bus 32 receives the output from the memory 14.

Figure 4:
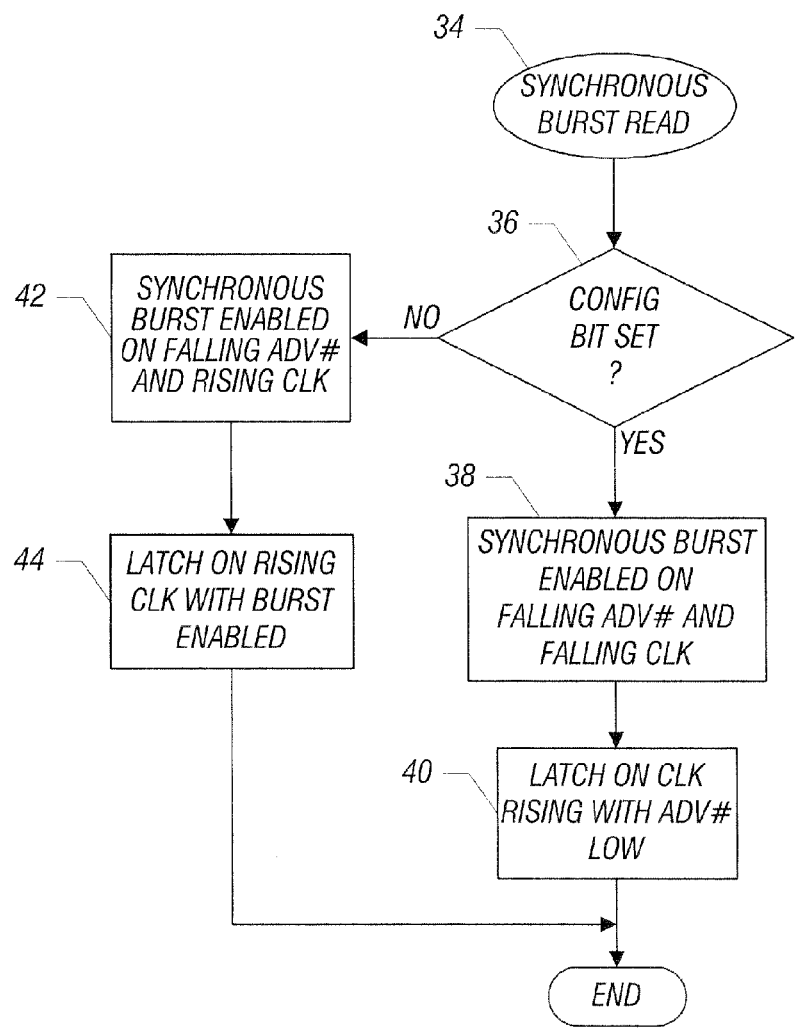
FIG. 4 is a flow chart for one embodiment of the present invention.

Referring to FIG. 4, in accordance with some embodiments of the present invention, a sequence 34 may selectively implement one of two different synchronous burst read modes. These synchronous burst read modes may be selected by the memory controller 12 using the signal CR to select a bit within the read state machine 18b. The synchronous burst read mode selection sequence 34 may be implemented in hardware, software, or firmware.

Initially, a configuration register bit, for example in the read state machine 18b, may be set or reset by the controller 12, as indicated in diamond 36. A check at diamond 36 determines whether the configuration bit is set or reset. If it is set, then the synchronous burst mode is enabled on the falling ADV# and falling clock CLK signals, as indicated in block 38. The mode is latched on the CLK rising edge with ADV# low, as indicated in block 40.

Alternatively, if the configuration bit is not set by the controller 12, then the synchronous burst read mode is enabled on the falling ADV# and rising CLK signal, as indicated in block 42. Then, the latency count is initiated and the circuit latches on the rising CLK signal with burst read enabled, as indicated in block 44.

Some flash products have adopted an address latching mechanism called ADV#-or-CLK. In this mechanism, addresses are latched by the first of either the rising ADV# edge or the next valid CLK edge with ADV# low. This mechanism has set up and hold issues at high clock frequencies. The problem is emphasized by some memory controllers that generate critical timing issues. One critical timing issue occurs when ADV# and CLK# are synchronous and, particularly, when the falling edge of ADV# is synchronous with the rising edge of CLK.

In accordance with embodiments of the present invention, the memory 14 may be configured to optimize the communication channel between the memory controller 12 and the memory 14, reducing the critical timing issues and allowing higher maximum frequencies. The synchronous burst read mode is enabled with the first falling CLK edge and the ADV# low and the addresses are latched on the first CLK rising edge with burst enable. A latency counter starts on the first CLK rising edge with burst enable.

A first type of memory controller selects a synchronous burst read by synchronizing the falling edge of ADV# with the falling edge of CLK, keeping for example, ADV# low for one clock cycle. The second type of memory controller selects the synchronous burst enable by synchronizing the falling edge of ADV# with the rising edge of CLK, keeping the ADV#, for example low, for one clock cycle. Thus, a different configuration bit may be set by the memory controller depending on memory controller type.

A memory controller sets this bit by providing the signal CR to the read state machine 18b. With the first configuration, ADV# set up and hold timing requirements, with respect to CLK, are met. The addresses are latched on the first CLK rising edge with ADV# low, as shown in FIG. 1. The latency counter starts on the first CLK rising edge with ADV# low.

Figure 2:
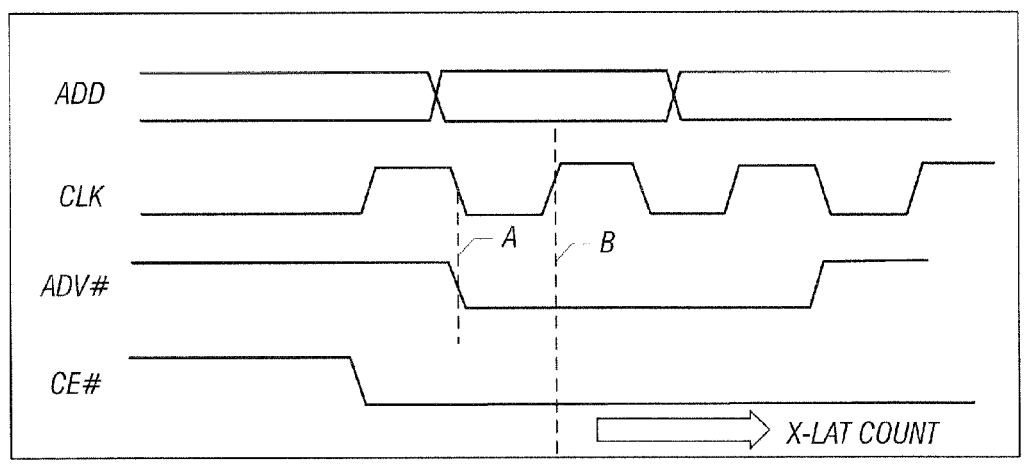
FIG. 2 is a timing diagram showing the pertinent signals in one mode of burst transfer.

With the first configuration, shown in FIG. 2, the ADV# set up and hold timing, with respect to CLK, are met. The address is latched on the first CLK rising edge with the ADV# low, as indicated at B in FIG. 2. The latency counter starts in the first CLK rising edge with ADV# low, as indicated at B.

Figure 3:
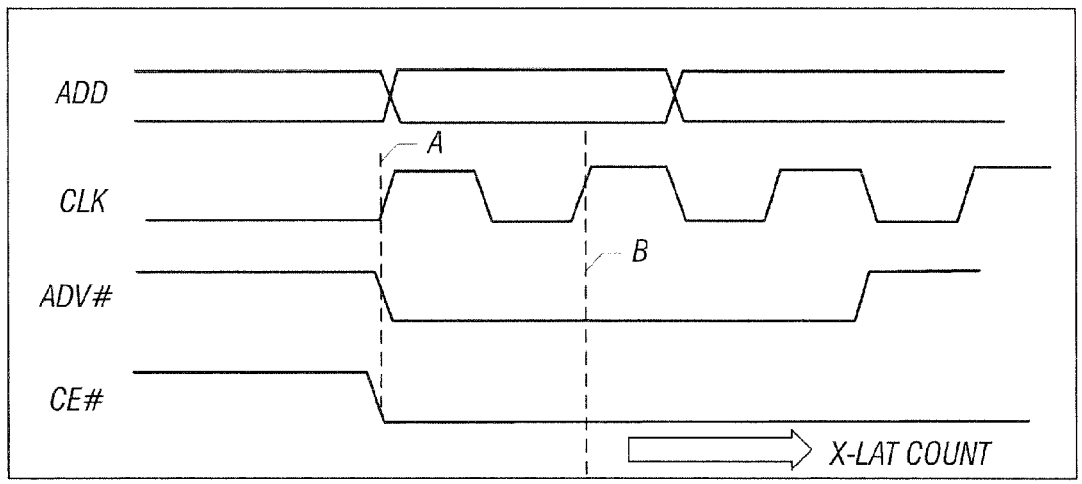
FIG. 3 is a timing diagram for another mode of burst transfer.

With the second configuration, shown in FIG. 3, ADV# set up and hold timing, with respect to CLK, is critical. The synchronous burst read is enabled with the first falling CLK edge with ADV# low. The addresses latched on the first CLK rising edge would burst enable. The latency counter starts on the first CLK rising edge with burst enabled.

As shown in FIG. 3, the addresses are latched at B. The latency count starts at B, namely, at the first rising CLK edge after ADV# is sampled low on the falling edge indicated at A. Note that in both configurations, ADV# is no longer a latching signal. The latching signal is, instead, the rising clock edge CLK.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
providing an asynchronous memory with the ability to selectively enter a first synchronous burst read mode or a second synchronous burst read mode based on a signal from a memory controller.

2. The method of claim 1 including providing a register which stores a configuration bit to select one of the first or second modes.

3. The method of claim 2 wherein said first synchronous burst read mode is enabled on the falling ADV# and falling CLK signals.

4. The method of claim 3 wherein addresses are latched on a rising CLK signal with the ADV# signal being low.

5. The method of claim 2 wherein said second synchronous burst mode is enabled on the falling ADV# and rising CLK signals.

6. The method of claim 5, latching addresses on the rising CLK signal with burst enabled.

7. A memory comprising:
a memory array; and
a device to selectively enable said memory to enter a first synchronous burst read mode or a second synchronous burst read mode based on a signal from a memory controller.

8. The apparatus of claim 7, said memory including a register to store a configuration bit to select one of said first and second modes.

9. The apparatus of claim 8 wherein said first synchronous burst read mode is enabled on the falling ADV and falling CLK signals.

10. The apparatus of claim 9 wherein addresses are latched on the rising CLK signal with the ADV# signal being low.

11. The apparatus of claim 8 wherein said second synchronous burst mode is enabled on the falling ADV# and rising CLK signals.

12. The apparatus of claim 11, said device to latch the addresses on the rising CLK signal with burst enabled.

13. A system comprising:
a memory controller; and
a memory coupled to said memory controller, said memory including an array and a device to selectively enable said memory to enter a first synchronous burst read mode or second synchronous burst read mode based on a signal from said memory controller.

14. The system of claim 13 wherein said memory is a flash memory.

15. The system of claim 13, said memory including a register to store a configuration bit to select one of said first and second modes.

16. The system of claim 15 wherein said first synchronous burst read mode is enabled on the falling ADV# and falling CLK signals.

17. The system of claim 16 wherein addresses are latched on the rising CLK signal with the ADV# signal being low.

18. The system of claim 15 wherein said second synchronous burst mode is enabled on the falling ADV# and rising CLK signals.

19. The system of claim 18, said device to latch the addresses on the rising CLK signal with burst enabled.

20. The system of claim 15 wherein said bit is supplied by said memory controller.

* * * * *